(12) United States Patent
Wang et al.

(10) Patent No.: US 8,811,010 B2
(45) Date of Patent: Aug. 19, 2014

(54) ELECTRONIC DEVICE

(75) Inventors: Zhen-Yu Wang, Shenzhen (CN);
Chang-Shen Chang, New Taipei (TW);
Ben-Fan Xia, Shenzhen (CN)

(73) Assignees: Hong Fu Jin Precision Industry (ShenZhen) Co., Ltd., Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 203 days.

(21) Appl. No.: 13/491,569

(22) Filed: Jun. 7, 2012

(65) Prior Publication Data
US 2013/0286588 A1 Oct. 31, 2013

(30) Foreign Application Priority Data
Apr. 27, 2012 (CN) .......................... 2012 1 0127465

(51) Int. Cl.
*G06F 1/20* (2006.01)
*H05K 7/20* (2006.01)

(52) U.S. Cl.
USPC ............ 361/679.47; 361/679.48; 361/679.49; 361/679.5; 361/679.54; 361/679.55; 361/695; 361/697; 361/703; 361/704; 361/709; 165/185

(58) Field of Classification Search
USPC ............................ 361/679.46–679.5, 679.52, 361/679.54–679.55, 694–695, 697, 700, 361/703–704, 709–710; 165/104.21, 165/104.33, 185
See application file for complete search history.

(56) References Cited

U.S. PATENT DOCUMENTS 7,643,284 B2 *  1/2010  Nakamura ............... 361/679.47
7,740,054 B2 *  6/2010  Yang ....................... 165/104.33

* cited by examiner

*Primary Examiner* — Robert J Hoffberg
(74) *Attorney, Agent, or Firm* — Novak, Druce, Connolly Bove + Quigg LLP

(57) ABSTRACT

An exemplary electronic device includes a container, a fan assembly and a duct received in the container. The fan assembly includes a centrifugal fan and a fin group thermally contacting an electronic component in the container. An air passage is defined between each adjacent fins of the fin group. An inner side of the fin group is mounted on an outlet of the centrifugal fan. A bottom surface of the fin group and an inner surface of the container cooperatively define a first channel therebetween. The duct includes an inlet and a first outlet. Airflow guided by the centrifugal fan flows through the duct and the first channel to cool a bottom end of the fin group, then is absorbed into the centrifugal fan from an inlet of the centrifugal fan, and then flow through the air passages of the fin group to cool a central portion the fin group.

19 Claims, 5 Drawing Sheets

ELECTRONIC DEVICE

BACKGROUND

1. Technical Field

The disclosure generally relates to electronic devices, and particularly to an electronic device having stable and reliable performance.

2. Description of Related Art

Conventional heat dissipation devices dissipate heat generated from electronic components of electronic devices. The heat dissipation device includes a base plate, a fin group, and a fan. A bottom end of the fin group is mounted on a top of the base plate. The fan is mounted on a central portion of a lateral side of the fin group. A top end of the fin group thermally contacts a top cover of the electronic device. The base plate thermally contacts the electronic components to absorb heat generating from the electronic components and transfers heat to the fin group. Cool airflow generated by the fan flows through the fin group to cool it. However, the cool airflow mostly flows through a central portion of the fin group, so the top end and the bottom end of the fin group are prone to overheat. The top end transfers heat thereof to the top cover of the electronic device. Thus, users will feel uncomfortable or be scalded when they touched the top cover. If a plurality of through holes are defined in a shell of the fan to guide part of airflow generated by the fan directly cooling the top and bottom ends of the fin group, the electronic components may be overheat due to the guided airflow can not full exchanged heat with whole of the fin group.

What is needed, therefore, is an improved electronic device to overcome the above described shortcomings.

DETAILED DESCRIPTION

Embodiments of electronic device will now be described in detail below and with reference to the drawings.

Figure 1:
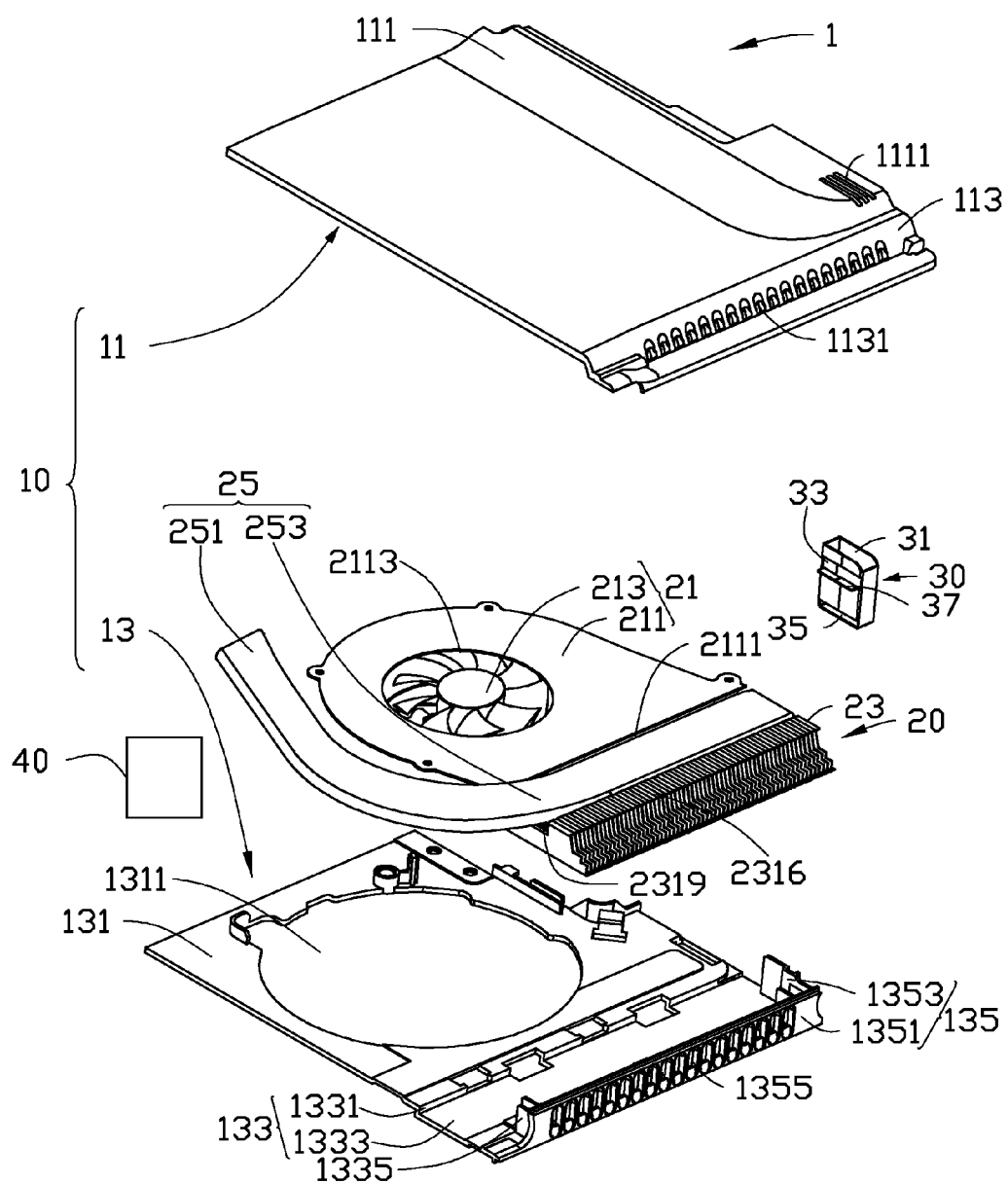
FIG. 1 is an exploded view of an electronic device according to an embodiment of the present disclosure.
Figure 5:
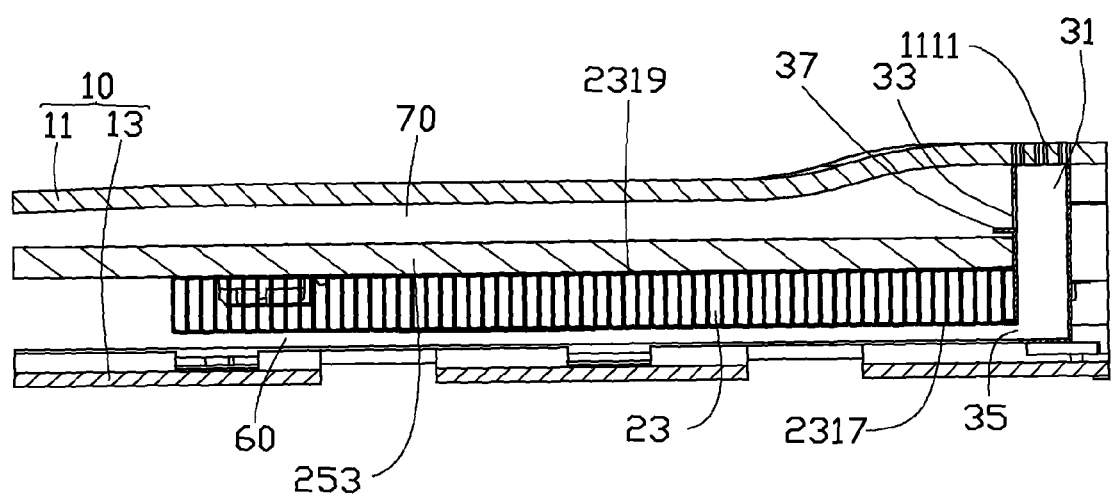
FIG. 5 is a cross-sectional view of the electronic device taken along a VI-VI line of FIG. 4.

Referring to FIG. 1 and FIG. 5, an electronic device 1 in accordance with an embodiment of the present disclosure is shown. The electronic device 1 includes a container 10, an electronic component 40 received in the container 10, a fan assembly 20 received in the container 10 and contacting the electronic component 40, and a duct 30 received in the container 10 and located at a side of the fan assembly 20.

Figure 2:
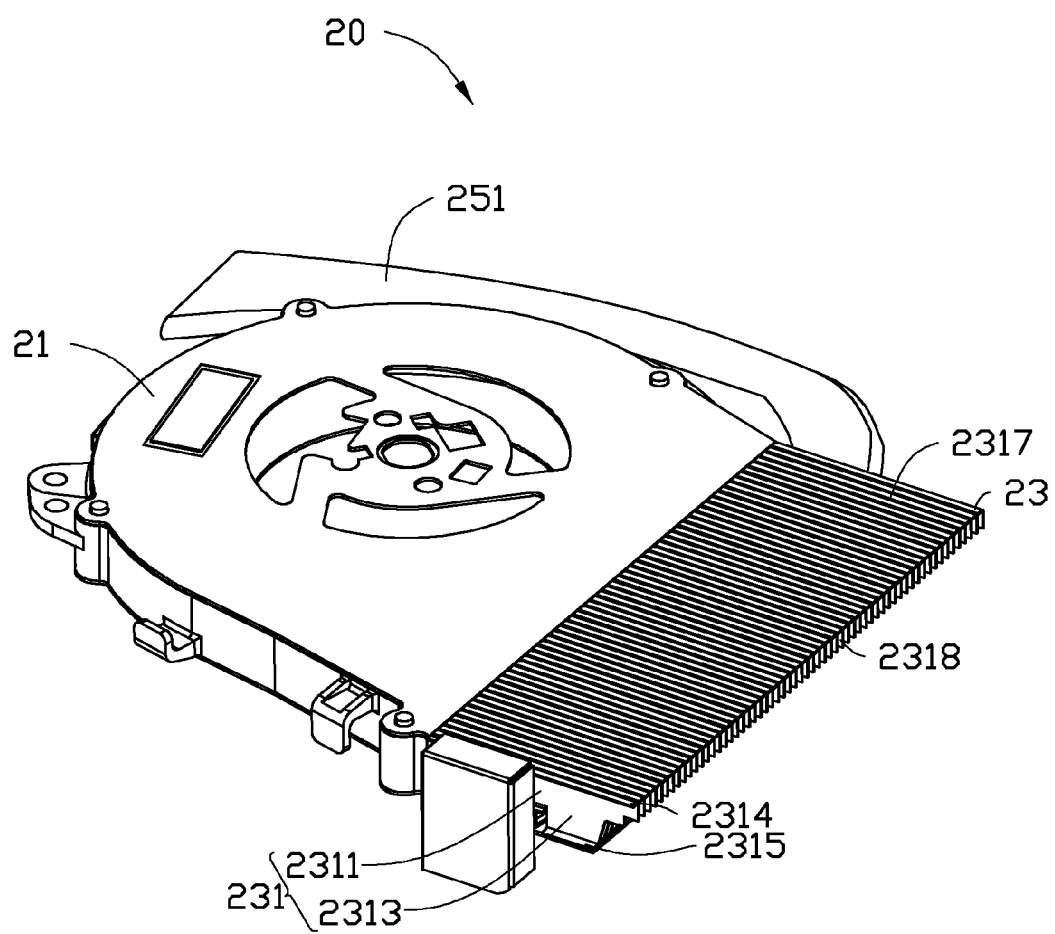
FIG. 2 is an inverted view of a fan of FIG. 1.

Referring also to FIG. 2, the fan assembly 20 includes a centrifugal fan 21, a fin group 23 mounted on a side of the centrifugal fan 21, and a heat pipe 25 mounted on the fin group 23 to contact the electronic component 40.

The centrifugal fan 21 includes a frame 211 and a blade assembly 213 received in the frame 211. The frame 211 is a hollow container. A rectangular outlet 2111 is defined at a lateral end of the frame 211 and a circular inlet 2113 is defined in a central portion of the frame 211 and extends through the frame 211. The inlet 2113 communicates with the outlet 2111. Top and bottom surface of the frame 211 are planar and parallel to each other.

Referring to FIGS. 1-2 again, the fin group 23 includes a plurality of fins 231. Each fin 231 is L-shaped and includes an elongated supporting sheet 2311 and a rectangular resisting sheet 2313 formed on a right side of the supporting sheet 2311. The supporting sheet 2311 and the resisting sheet 2313 are coplanar and integrally formed. A bottom end of the supporting sheet 2311 and a bottom end of the resisting sheet 2313 are coplanar and cooperatively formed a bottom end of the fin 231. A top end of the resisting sheet 2313 is located at a top of a top end of the supporting sheet 2311 and acts as a top end of the fin 231. A length of the resisting sheet 2313 is less than that of the supporting sheet 2311 along a longitudinal direction of the fin 231. A height of the resisting sheet 2313 is equal to a height of the fan 21 and larger than that of the supporting sheet 2311 along a transverse direction of the fin 231. A flange 2315 is formed on the top end of the resisting sheet 2313. A flange 2314 is formed on the bottom end of the fin 231. The flanges 2315, 2314 of the fin 231 are parallel to and face each other. When the fins 231 are assembled, the fins 231 are arranged side by side, the flanges 2315, 2314 of the rear fin 231 respectively abut against and are sealed with rear ends of the flanges 2315, 2314 of the front fin 231 to form an airproof top surface 2316 and an airproof bottom surface 2317. Each adjacent fins 231 are parallel to and spaced from each other. An air passage 2318 is defined between each adjacent fins 231. The top ends of the supporting sheets 2311 and lateral ends of the resisting sheets 2313 cooperatively form an L-shaped step 2319 to support the heat pipe 25.

The heat pipe 25 is an L-shaped flatted heat pipe and includes an evaporating section 251 and a condensing section 253 bended from a free end of the evaporating section 251. A width of the condensing section 253 is equal to or slightly less than that of the step 2319. A length of the condensing section 253 is equal to that of the step 2319.

When the fan assembly 20 is assembled, the evaporating section 251 of the heat pipe 25 is located at an outside of the fin group 23 and the condensing section 253 mounted on the step 2319 of the fin group 23 to transfer heat absorbed by the evaporating section 251 to the fin group 23. In this state, a bottom surface of the evaporating section 251 contacts the electronic component 40, a bottom surface of the condensing section 253 fully covers the top end of the supporting sheets 2311, a top surface of the condensing section 253 and the top surface 2316 of the fin group 23 are coplanar, and a lateral side of the condensing section 253 abuts the corresponding lateral ends of the resisting sheets 2313. A left end of the fin group 23 is mounted on the outlet 2111 of the fan 21 and the top surface and bottom surface of the fan 21 are respectively coplanar with the top surface the condensing section 253 and the bottom surface 2317 of the fin group 23. In this state, the top surface of the frame 2111, the top surface of the condensing section 253, and the top surface 2316 of the fin group 23 cooperatively form a top surface of the fan assembly 20, and the bottom surface 2317 of the fin group 23 and the bottom surface of the frame 2111 cooperatively form a bottom surface of the fan assembly 20.

Referring to FIG. 1 again, the container 10 includes a top cover 11 and a bottom cover 13. The top cover 11 includes an elongated top plate 111 and a convex sidewall 113 bended from a lateral end of the top plate 111. A plurality of slits 1111 are defined in the top plate 111 to allow airflow flowing in the container 10 therefrom. A plurality of apertures 1131 are defined in a central of the sidewall 113 to allow airflow in the container 10 exhausted therefrom.

The bottom cover 13 includes a bottom plate 131, an extending plate 133 extending outwardly from a lateral end of the bottom plate 131, and a side plate 135 extending upwardly from a lateral side of the extending plate 133. The bottom plate 131 is an elongated plate, and defines a circular opening 1311 at a central portion thereof. The extending plate 133 has an L-shaped configuration and includes an elongated connecting portion 1331 extending downwardly from the lateral end of the bottom plate 131, and an elongated stretching portion 1333 extending outwardly from a bottom end of the connecting portion 1331. Two spaced posts 1335 are formed on opposite ends of an outer side of a top surface of the stretching portion 1333. A height of the post 1335 is equal to that of the connecting portion 1331. The posts 1335 and the connecting portion 1331 cooperatively support the fan assembly 20. The side plate 135 has an L-shaped configuration and includes a supporting wall 1351 and a baffling wall 1353. The supporting wall 1351 is elongated and extends upwardly from the outer side of the stretching portion 1335. A plurality of apertures 1355 are defined at a central portion of the supporting wall 1351 along a longitudinal direction of the supporting wall 1351. The baffling wall 1353 is perpendicular to the supporting wall 1351 and located at an end of the stretching portion 1335. The supporting wall 1351 and the baffling wall 1353 are located at outsides of the posts 1335 and spaced from the posts 1335.

Figure 3:
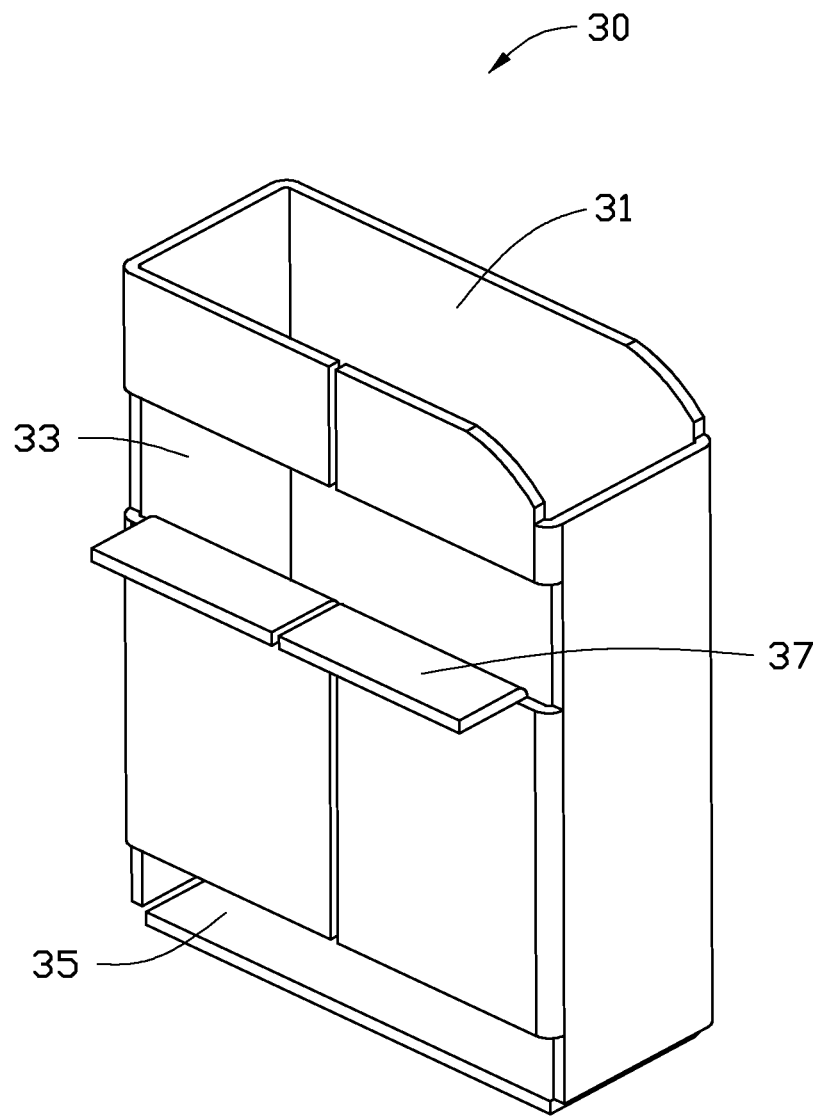
FIG. 3 is an enlarged view of a duct of FIG. 1.

Referring to FIG. 3, the duct 30 is a hollow cuboid. A bottom end of the duct 30 is closed and a top end of the duct 30 is opened to define an inlet 31 therein. A rectangular second outlet 33 and a rectangular first outlet 35 are defined at a side of the duct 30. The second outlet 33 is located at a top of the duct 30. The first outlet 35 is located at a bottom of the duct 30. A flange 37 is extending outwardly from a bottom edge of the second outlet 33. The inlet 31, the second outlet 33, and the first outlet 35 are communicated.

Figure 4:
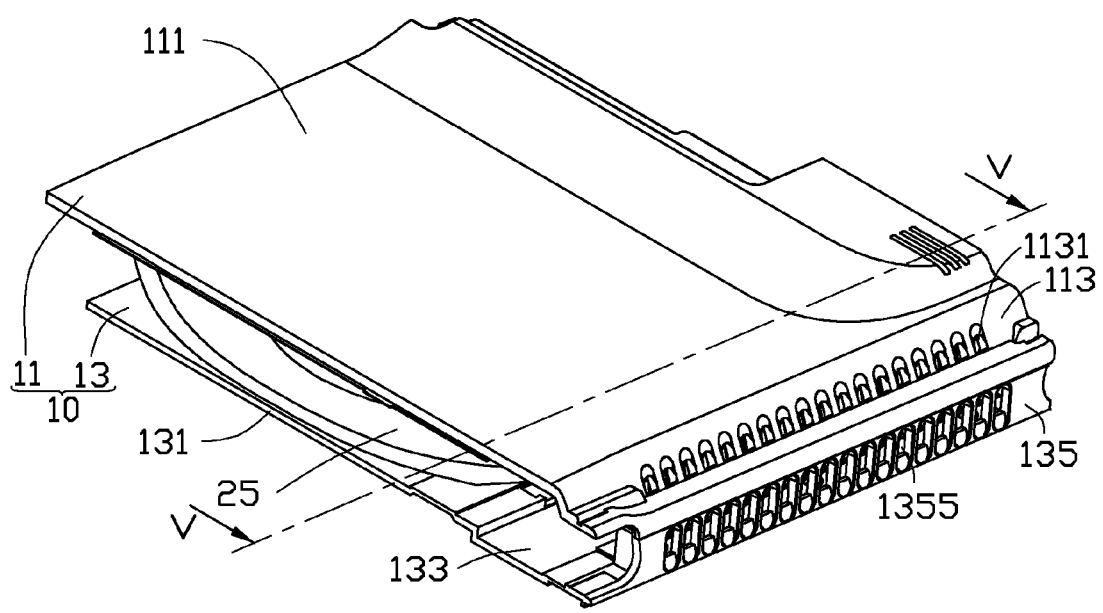
FIG. 4 is an assembled view of the electronic device of FIG. 1.

Referring to FIGS. 4-5, when the electronic device 1 is assembled, the assembled fan assembly 20 is mounted on the bottom cover 13, firstly. In this state, opposite sides of the bottom surface 2317 of the fin group 23 abut against the posts 1335 and the top end of the connecting portion 1331, and outer edges of the resisting sheets 2313 of the fins 23 abut inner surface of the supporting wall 1351. The bottom surface 2317 is spaced from the top surface of the stretching portion 1333. The centrifugal fan 21 is mounted on the bottom plate 131. The inlet 2113 of the centrifugal fan 21 is aligned with the opening 1311 of the bottom plate 131. The bottom surface 2317, the inner surface of the supporting wall 1351, the top surface of the stretching portion 1333 and an inner surface of the connecting portion 1331 cooperatively define a first channel 60 therebetween.

Then the duct 30 is sandwiched between an inner surface of the baffling wall 1353 and one of the posts 1335 near the baffling wall 1353. The bottom end of the duct 30 abuts the top surface of the stretching portion 1333, and a bottom side of the flange 37 abuts the top surface 2316 of the fin group 23 and the top surface of the condensing section 253 of the heat pipe 25. The duct 30 is located at an outer end of the fin group 23 and the first outlet 35 is aligned with the first channel 60. The second outlet 33 is located at a top of the fan assembly 20.

The top cover 11 covers the bottom cover 13. In this state, a bottom end of the side wall 113 of the top cover 11 abuts against a top end of the supporting wall 1351 of the bottom cover 13, and a bottom surface top plate 111 abuts against a top end of the duct 30. The inlet 31 of the duct 30 communicates with the slits 1111 of the top plate 111. The outer edges of the resisting sheets 2313 of the fins 23 abut an inner surface of the side wall 113. The bottom surface of the top plate 111 is spaced from the top surface of the fan assembly 20. The bottom surface of the top plate 111, the top surface of the fan assembly 20 and an inner surface of the side wall 113 cooperatively define a second channel 70 therebetween. The second outlet 33 of the duct 30 is located at an outside of the second channel 70 and aligned with the second channel 70. The first channel 60 and the second channel 70 are respectively located at bottom and top sides of the fan assembly 20 and can not communicate with each other. A longitudinal direction of the first channel 60 is perpendicular to a longitudinal direction of the air passage 2318 of the fin group 23.

In use, the evaporating section 251 of the heat pipe 25 absorbs heat of the electronic component 40 and transfers the heat to the fin group 23 via the condensing section 253. The centrifugal fan 21 guides airflow located at an outside of the electronic device 1 into the duct 30 from the slits 1111 of the top cover 11 and the inlet 31 of the duct 30. Part of the airflow of the duct 30 flows into the first channel 60 through the first outlet 35 along the longitudinal direction of the first channel 60 to cool the bottom surface of the fin group 23, then is exhausted from the first channel 60 from an end of the first channel 60 away from the duct 30 and absorbed into the centrifugal fan 21 from the opening 1311 of the bottom cover 13 and a bottom end of the inlet 2113 of the centrifugal fan 21. The other part of the airflow of the duct 30 flows into the second channel 70 from the second outlet 33 to cool the top surface 2316 of the fin group 23 and the top surface of the condensing section 253, then is absorbed into the centrifugal fan 21 from a top end of the inlet 2113 of the centrifugal fan 21. The airflow absorbed by the centrifugal fan 21 flows through the air passages 2318 of the fin group 23 and is exhausted from the electronic device 1 from the apertures 1355, 1131 of the container 10. In this state, each the top end, the bottom end, and a central portion of the fin group 23 is fully cooled. Thus, the electronic device 1 has stable and reliable performance.

It is to be further understood that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An electronic device comprising:
   a hollow container; an electronic component received in the container;
   a fan assembly received in the container and comprising a centrifugal fan and a fin group thermally contacting the electronic component, an outlet defined at a lateral side of the centrifugal fan, and a top inlet and a bottom inlet defined at a central portion of the centrifugal fan and respectively extending through a top end and a bottom end of the centrifugal fan, the fin group comprising a plurality of fins, an air passage defined between each adjacent fins of the plurality of fins, an inner side of the fin group being mounted on the outlet of the centrifugal fan, a bottom surface of the fin group and an inner surface of the container cooperatively defining a first channel therebetween; and
   a duct received in the container and located at an outer end of the fan assembly, the duct comprising an inlet and a first outlet, the first outlet aligned with an outer end of the first channel;
   wherein the centrifugal fan guides airflow located at an outside of the electronic device into the duct from the inlet of the duct, then the airflow in the duct flows through the first channel to cool a bottom end of the fin group, then flows out of the first channel and is absorbed into the centrifugal fan through the bottom inlet of the centrifugal fan, and then flow through the air passages of the fin group to cool a central portion the fin group and is exhausted from the electronic device.

2. The electronic device of claim 1, wherein a longitudinal direction of the first channel is perpendicular to a longitudinal direction of each of the air passages.

3. The electronic device of claim 1, wherein the container comprises a bottom cover, the bottom cover comprises a stretching portion, a connecting portion extending upwardly from a first lateral side of the stretching portion, and two posts extending from a second lateral side of the stretching portion, opposite sides of the bottom surface of the fin group respectively abut against a top end of the connecting portion and top ends of the two posts, the bottom surface of the fin group is spaced from a top surface of the stretching portion, and the bottom surface of the fin group, the top surface of the stretching portion and an inner surface of the connecting portion cooperatively define the first channel therebetween.

4. The electronic device of claim 3, wherein the bottom cover comprises a bottom plate extending outwardly from the top end of the connecting portion and supporting the bottom end of the centrifugal fan, and an opening is defined in the bottom plate and aligned with the bottom inlet of the centrifugal fan.

5. The electronic device of claim 3, wherein the bottom cover comprises a supporting wall extending upwardly from the second lateral side of the stretching portion and located at an outside of the fin group, and a plurality of apertures are defined in the supporting wall and communicate the air passages of the fin group.

6. The electronic device of claim 5, wherein the bottom cover further comprises a baffling wall bended from the supporting wall and located at an end of the stretching portion, the stretching portion is spaced from the two posts, and opposite sides of a lateral end of the duct are sandwiched between the one of the two posts and the baffling wall, and a bottom end of the duct abuts against the top surface of the stretching portion.

7. The electronic device of claim 3, wherein a top surface of the fin group and another inner surface of the container cooperatively define a second channel therebetween, the duct further comprises a second outlet aligned with an end of the second channel, a part of the airflow in the duct flows into the second channel from the second outlet to cool a top end of the fin group, then the part of the airflow is absorbed into the centrifugal fan through the top inlet of the centrifugal fan, and finally flow through the air passages of the fin group to cool the central portion the fin group.

8. The electronic device of claim 7, wherein the container comprises a top cover, the top cover comprises a top plate located above the top end of the fin group and a side wall extending downwardly from a lateral end of the top plate, the side wall is located at an outside of the fin group and engages with the bottom cover, and a bottom surface of the top plate, an inner surface of the side wall, and the top surface of the fin group cooperatively define the second channel therebetween.

9. The electronic device of claim 8, wherein the first channel and the second channel are located at opposite sides of the fin group and can not communicate with each other.

10. The electronic device of claim 8 further comprising a heat pipe, the heat pipe comprising an evaporating section and a condensing section bended from a free end of the evaporating section, the fin group having an L-shaped configuration, a step defined at lateral side of the top end of the fin group, the condensing section received in the step and the evaporating section located at the outside of the fin group to contact the electronic component.

11. The electronic device of claim 10, wherein the condensing section is sandwiched between the centrifugal fan and the top end of the fin group, a bottom surface of the condensing section fully covers a top end of the step, and a top surface of the condensing section is coplanar with the top surface of the fin group.

12. The electronic device of claim 11, wherein the top surface and the bottom surface of the fin group are airproof surfaces.

13. The electronic device of claim 7, wherein the duct further comprises a flange abutting the top surface of the fin group.

14. An electronic device comprising:
a hollow container comprising a top cover and a bottom cover engaging with the top cover;
an electronic component received in the container;
a fan assembly received in the container and comprising a centrifugal fan and a fin group thermally contacting the electronic component, an outlet defined at a lateral side of the centrifugal fan, and a top inlet and a bottom inlet defined at a central portion of the centrifugal fan and respectively extending through a top end and a bottom end of the centrifugal fan, the fin group comprising a plurality of fins, an air passage defined between each adjacent fins of the plurality of fins, an inner side of the fin group being mounted on the outlet of the centrifugal fan, a bottom surface of the fin group located above a top surface of the bottom cover and a first channel defined between the bottom surface of the fin group and the top surface of the bottom cover, a top surface of the fin group located under a bottom surface of the top cover, and a second channel defined between the top surface of the fin group and the bottom surface of the top cover;
a duct received in the container and located at an outer end of the fan assembly, the duct comprising an inlet, a first outlet an a second outlet, the first outlet and the second outlet respectively aligned with an outer end of the first channel and an outer end of the second channel;
wherein airflow guided by the centrifugal fan flows into the duct, and a part of the airflow flows through the first channel to cool a bottom end of the fin group, then flows out of the first channel and is absorbed into the centrifugal fan through the bottom inlet of the centrifugal fan, another part of the airflow flows into the second channel to cool a top end of the fin group and then is absorbed into the centrifugal fan through the top inlet of the centrifugal fan, and the absorbed airflow of the centrifugal fan then flows through the air passages of the fin group to cool a central portion the fin group and is exhausted from the electronic device.

15. The electronic device of claim 14, wherein a longitudinal direction of the first channel is perpendicular to a longitudinal direction of each of the air passages.

16. The electronic device of claim 14, wherein the first channel and the second channel are located at opposite sides of the fin group and can not communicate with each other.

17. The electronic device of claim 14, wherein a plurality of slits are defined in the top cover, opposite ends of the duct respectively abut against the bottom surface of the top cover and the top surface of the bottom cover, and the inlet of the duct communicates with the slits of the top cover.

18. The electronic device of claim 17, wherein a flange is bended from the duct and abuts the top surface of the fin group.

19. The electronic device of claim 14 further comprising a heat pipe, the heat pipe comprising an evaporating section and a condensing section bended from a free end of the evaporating section, the evaporating section contacting the electronic component and the condensing section mounted on the fin group.

* * * * *